(12) United States Patent
Park (10) Patent No.: US 8,612,841 B2
(45) Date of Patent: Dec. 17, 2013

(54) ERROR CODE PATTERN GENERATION CIRCUIT AND SEMICONDUCTOR MEMORY DEVICE INCLUDING THE SAME

(75) Inventor: Jung-Hoon Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 434 days.

(21) Appl. No.: 12/980,450

(22) Filed: Dec. 29, 2010

(65) Prior Publication Data

US 2012/0144278 A1 Jun. 7, 2012

(30) Foreign Application Priority Data

Dec. 6, 2010 (KR) ........................ 10-2010-0123434

(51) Int. Cl.
*G06F 11/00* (2006.01)

(52) U.S. Cl.
USPC .......................................................... 714/807

(58) Field of Classification Search
USPC .......................................................... 714/807
See application file for complete search history.

(56) References Cited

U.S. PATENT DOCUMENTS

| 6,526,537 | B2 * | 2/2003 | Kishino | 714/763 |
|---|---|---|---|---|
| 7,904,787 | B2 * | 3/2011 | Clark et al. | 714/758 |
| 8,060,813 | B2 * | 11/2011 | Yoon et al. | 714/807 |
| 8,281,221 | B2 * | 10/2012 | Sakimura et al. | 714/764 |
| 2002/0007476 | A1 * | 1/2002 | Kishino | 714/763 |
| 2008/0263429 | A1 * | 10/2008 | Jeong | 714/764 |
| 2009/0307569 | A1 * | 12/2009 | Wickeraad | 714/807 |

FOREIGN PATENT DOCUMENTS

| JP | 2005-354310 | 12/2005 |
|---|---|---|
| KR | 1019990077597 | 10/1999 |
| KR | 1020010100509 | 11/2001 |
| KR | 1020030017310 | 3/2003 |

OTHER PUBLICATIONS

Office Action issued by the Korean Intellectual Property Office on Mar. 22, 2012.
Notice of Allowance issued by the Korean Intellectual Property Office on Oct. 15, 2012.

* cited by examiner

*Primary Examiner* — Bryce Bonzo
*Assistant Examiner* — Elmira Mehrmanesh
(74) *Attorney, Agent, or Firm* — IP & T Group LLP (57) ABSTRACT

An error code pattern generation circuit includes a first storage unit configured to store at least one bit of an error code, and output error data for a first time period; and a second storage unit configured to store at least one remaining bit of the error code and output the error data for a second time period which is different from the first time period.

12 Claims, 8 Drawing Sheets

ERROR CODE PATTERN GENERATION CIRCUIT AND SEMICONDUCTOR MEMORY DEVICE INCLUDING THE SAME

CROSS-REFERENCE TO RELATED APPLICATIONS

The present application claims priority of Korean Patent Application No. 10-2010-0123434, filed on Dec. 6, 2010, which is incorporated herein by reference in its entirety.

BACKGROUND OF THE INVENTION

Exemplary embodiments of the present invention relate to a semiconductor design technology, and more particularly, to a circuit for generating an output pattern of an error code and a semiconductor memory device including the same.

As semiconductor design technologies are being advanced and operational speeds of systems are becoming faster, circuit devices for receiving data, storing the received data, and outputting stored data are to operate at a high speed. Accordingly, a semiconductor memory device such as a Dynamic Random Access Memory (DRAM) device has been implemented with a Double Data Rate (DDR) method for inputting/outputting data in synchronization with a falling edge of a system clock as well as the rising edge of the system clock. Recently, a DRAM device using DDR2 and DDR3 method for inputting/outputting 4-bit or 8-bit data per one clock cycle has been used.

However, as a data transfer speed of the circuit devices becomes faster, a probability of a data transfer error also increases. Thus, a device and method to secure the data transfer is useful. In obtaining such a feature, an error code for verifying an error is generated whenever data are generated, and the error code is transferred along with the data. Such an error code includes an Error Detection Code (EDC), which is used in detecting the generated error, and an Error Correction Code (ECC), which is used to correct the error if an error occurs.

Figure 1:
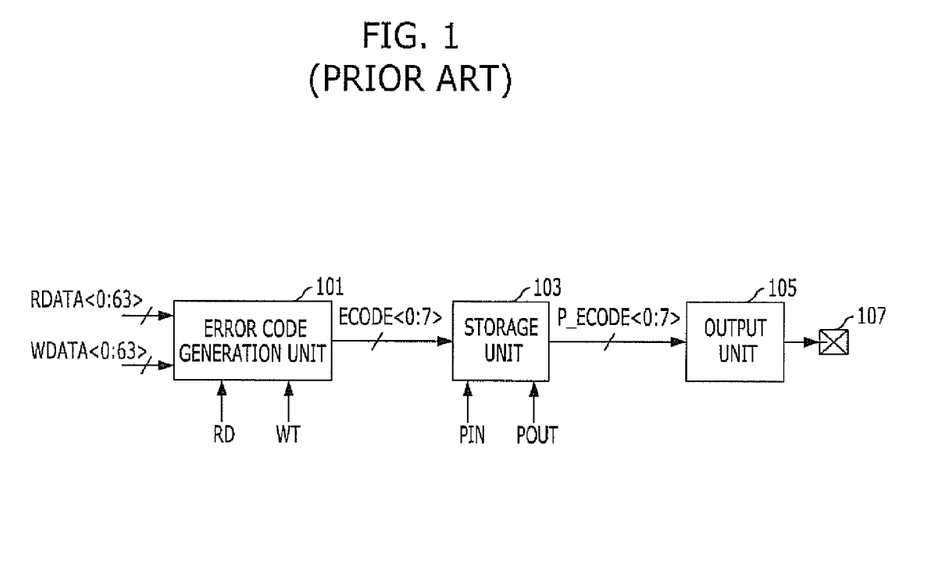
FIG. 1 is a block diagram of an error code generation circuit used in a conventional semiconductor memory device.

FIG. 1 is a block diagram of an error code generation circuit used in a conventional semiconductor memory device.

Referring to FIG. 1, the error code generation circuit includes an error code generation unit 101, a storage unit 103 and an output unit 105.

The error code generation unit 101 is configured to generate an error code ECODE<0:7> by using read data RDATA<0:63> in response to a read command RD or using write data WDATA<0:63> in response to a write command WT. Here, the read data RDATA<0:63> are composed of 64-bit parallel data, which are outputted to outside from a memory cell region of the semiconductor memory device (not shown), and the write data WDATA<0:63> are composed of 64-bit parallel data, which are inputted to the semiconductor memory device from the outside. The error code ECODE<0:7> is composed of 8-bit parallel data. For example, the error code generation unit 101 may generate the 8-bit error code ECODE<0:7> as an error detection code (EDC) by performing Cyclic Redundancy Check (CRC) using a CRC-8 calculator on the 64-bit read data RDATA<0:63> or the 64-bit write data WDATA<0:63>.

Figure 2:
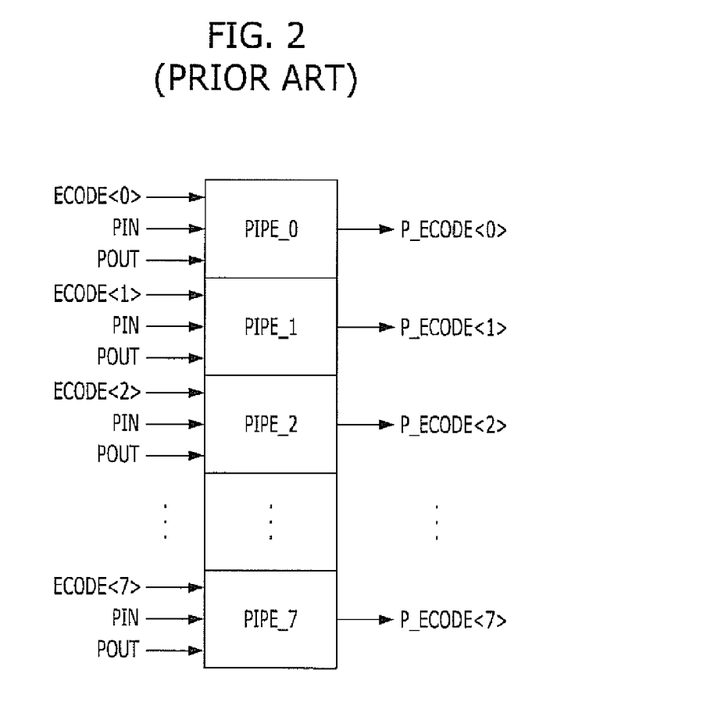
FIG. 2 is a detailed block diagram illustrating a storage unit shown in FIG. 1.

The storage unit 103 is configured to temporarily store the error code ECODE<0:7> and output the stored code as an error data P_ECODE<0:7> in synchronization with a system clock. As shown in FIG. 2, the storage unit 103 may comprise first to eighth pipe registers PIPE_0 to PIPE_7 for storing the error code ECODE<0:7> bit-by-bit. Each of the first to eighth pipe registers PIPE_0 to PIPE_7 stores a corresponding one of bits ECODE<0> to ECODE<7> in response to an input control signal PIN and outputs the stored bit to the output unit 105 in response to an output control signal POUT.

The output unit 105 is configured to output the error data P_ECODE<0:7> to the outside of the semiconductor memory device through an output pad 107. The output unit 105 is implemented with a parallel-to-serial converter for receiving the error data P_ECODE<0:7>, which is transferred in parallel from the storage unit 103, and converting the error data P_ECODE<0:7> to data in series.

Figure 3:
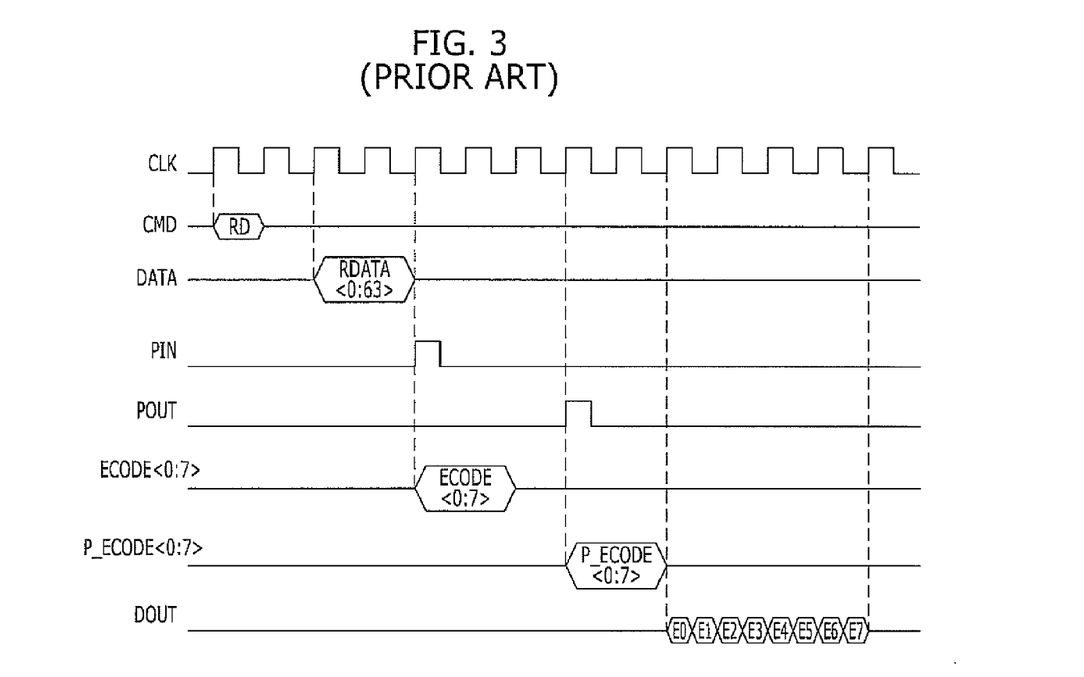
FIG. 3 is a timing diagram illustrating an operation for generating and outputting an error code in the semiconductor memory device of FIG. 1.

FIG. 3 is a timing diagram illustrating an operation for generating and outputting the error code ECODE<0:7> in the semiconductor memory device of FIG. 1.

Referring to FIG. 3, when the read command RD is inputted to the semiconductor memory device, the read data RDATA<0:63> is transferred to the error code generation unit 101 in parallel from a memory cell region through global data lines (GIO). The error code generation unit 101 generates the 8-bit error code ECODE<0:7> based on the read data RDATA<0:63>. The storage unit 103 temporarily stores the error code ECODE<0:7> in response to the input control signal PIN and outputs the error data P_ECODE<0:7> to the output unit 105 in response to the output control signal POUT. The output unit 105 converts the error data P_ECODE<0:7> in series, and outputs the serialized error data P_ECODE<0:7> to the outside of the semiconductor memory device through the output pad 107.

Here, an error code generation circuit used in a semiconductor memory device or a communication device is to be operated at a high-speed. However, in case where an external device for testing these devices cannot keep up with an operational speed of the error code generation circuit, the external device fails to recognize an error code outputted from the error code generation circuit. For example, when the semiconductor memory device outputs an 8-bit error code at a speed of 1 GHz and the external device for testing the semiconductor memory device operates at a speed of 500 MHz, the external device may recognize only 4-bit error code among the 8-bit error code which is outputted in series from the semiconductor memory device.

SUMMARY OF THE INVENTION

An exemplary embodiment of the present invention is directed to an error code pattern generation circuit, which is capable of outputting an error code in various patterns, and a semiconductor memory device including the same.

In accordance with an exemplary embodiment of the present invention, an error code pattern generation circuit includes: a first storage unit configured to store at least one bit of an error code, and output error data for a first time period; and a second storage unit configured to store at least one remaining bit of the error code, and output the error data for a second time period which is different from the first time period.

In accordance with another exemplary embodiment of the present invention, a semiconductor memory device includes: an error code generation unit configured to generate an error code by using read data or write data; a pattern generation unit configured to generate error data by dividing the error code into first and second groups of data; and an error code output unit configured to output the error data.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
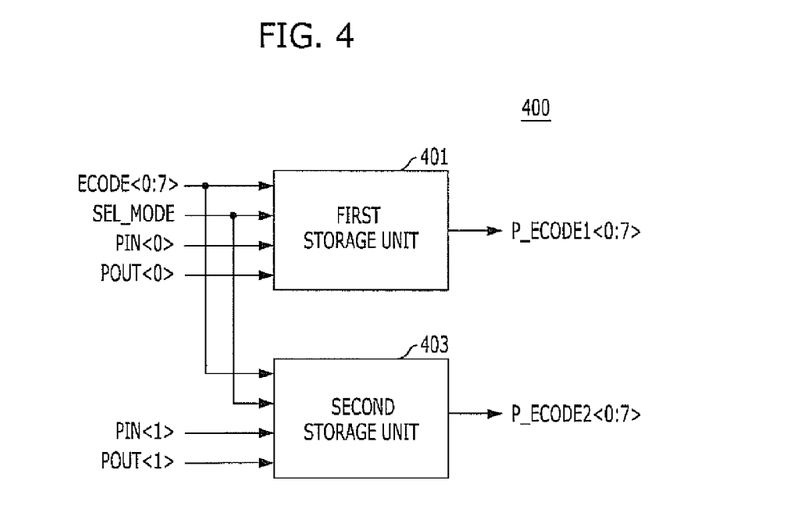
FIG. 4 is a block diagram of an error code pattern generation circuit in accordance with an exemplary embodiment of the present invention.

FIG. 4 is a block diagram of an error code pattern generation circuit in accordance with an exemplary embodiment of the present invention.

Referring to FIG. 4, the error code pattern generation circuit 400 comprises first and second storage units 401 and 403. The first storage unit 401 is configured to store some bits of an error code ECODE<0:7> and output a first error data P_ECODE1<0:7> for a first time period. The second storage unit 403 is configured to store the other bits of the error code ECODE<0:7> and output a second error data P_ECODE2<0:7> for a second time period which is different from the first time period.

In accordance with the embodiment of the present invention, the error code pattern generation circuit 400 operates in a different way depending on whether it operates in a normal mode and a conversion mode.

During the normal mode, the error code pattern generation circuit 400 operates in the same way the conventional storage unit 103 of FIG. 1 operates. That is, any one of the first and second storage units 401 and 403 may be used to store the error code ECODE<0:7> to generate and output the stored data in one cycle (that is, in one clock cycle). Accordingly, when two read commands (or write commands) are consecutively inputted, the error code pattern generation circuit 400 may be implemented to store the error code ECODE<0:7> corresponding to first read data (or write data) in the first storage unit 401 and to store the error code ECODE<0:7> corresponding to second read data (or write data) in the second storage unit 403.

On the contrary, during the conversion mode, the error code pattern generation circuit 400 divides the error code ECODE<0:7> into first and second group data and stores the first and second group data in the first and second storage units 401 and 403, respectively. Further, by outputting the first and second group data during different periods of time, respectively, the error code pattern generation circuit 400 may output the error code ECODE<0:7> in various patterns. More specifically, the error code pattern generation circuit 400 outputs the error code ECODE<0:7> in two cycles during the conversion mode, while the error code pattern generation circuit 400 outputs the error code ECODE<0:7> in one cycle during the normal mode. As a result, a window for outputting the error code ECODE<0:7> during the conversion mode may widen by, for example, two times more that that during the normal mode. Accordingly, even if an external test device operates at a frequency lower than that of the error code pattern generation circuit 400, the external test device can verify the error code ECODE<0:7> during the conversion mode.

While an embodiment is illustrated where the error code pattern generation circuit 400 includes two storage units 401 and 403, the error code pattern generation circuit 400 may alternatively include any reasonably suitable number of storage unit including four, six and more storage units. For example, the error code pattern generation circuit 400 may comprise four storage units. In this case, in the normal mode, the error code pattern generation circuit 400 stores four different error codes in four storage units, respectively, and outputs the stored error codes. Further, in the conversion mode, the error code pattern generation circuit 400 stores a first error code in first and second storage units to output the stored first error code and stores a second error code in third and fourth storage units to output the stored second error code.

Figure 5A:
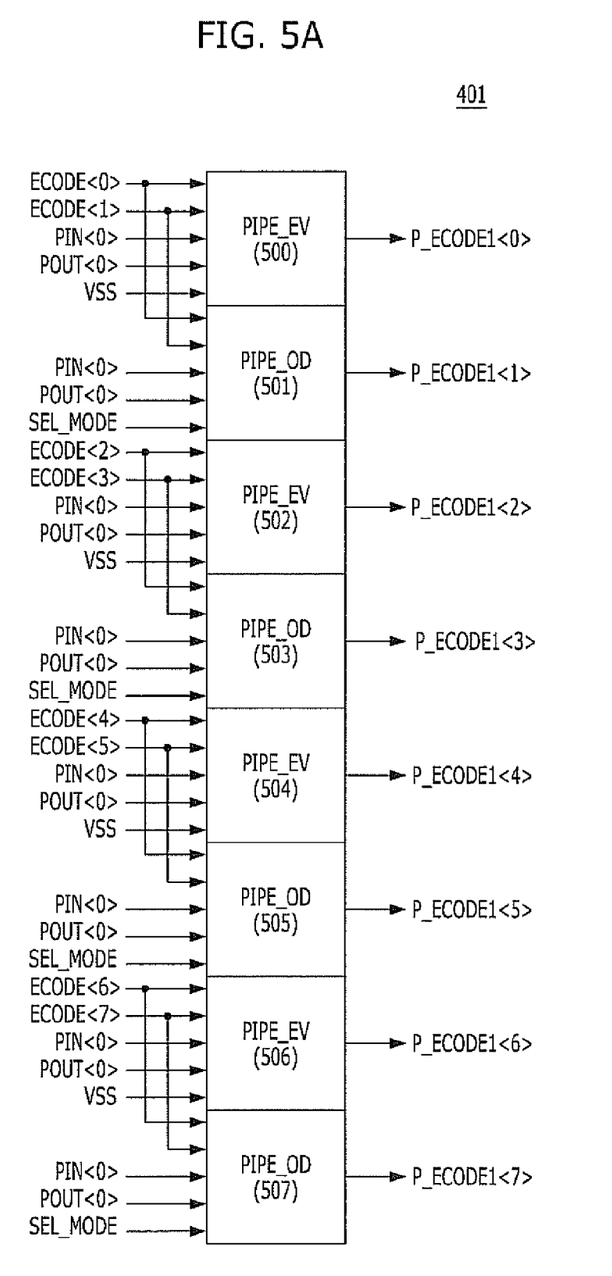
FIG. 5A is a detailed block diagram of a first storage unit shown in FIG. 4.

FIG. 5A is a detailed block diagram of the first storage unit 401 shown in FIG. 4.

Referring to FIG. 5A, the first storage unit 401 comprises a plurality of pipe registers 500 to 507, each configured to store a corresponding bit of the error code ECODE<0:7> bit-by-bit. In this embodiment, the error code ECODE<0:7> is composed of 8-bit parallel data, and thus the first storage unit 401 comprises 8 pipe registers 500 to 507 configured to store the 8 bits of the error code ECODE<0:7>.

Since the first storage unit 401 stores the error code ECODE<0:7> to generate and output the stored data in one cycle, a first input control signal PIN<0> and a first output control signal POUT<0> are inputted to all the pipe registers 500 to 507. That is, the pipe registers 500 to 507 store the error code ECODE<0:7> in response to the first input control signal PIN<0> and output the stored data as the first error data P_ECODE1<0:7> in response to the first output control signal POUT<0>.

For illustration purposes, the pipe registers 500 to 507 are divided into a first group of pipe registers PIPE_EV and a second group of pipe registers PIPE_OD. The first group of pipe registers PIPE_EV includes first to fourth even pipe registers 500, 502, 504 and 506 while the second group of pipe registers PIPE_OD includes first to fourth odd pipe registers 501, 503, 505 and 507. According to an example, the first group data comprise even-bit data such as ECODE<0>, ECODE<2>, ECODE<4> and ECODE<6> while the second group data comprise odd-bit data such as ECODE<1>, ECODE<3>, ECODE<5> and ECODE<7>.

Further, one bit of the first group data and one bit of the second group data are inputted to a corresponding one of the pipe registers 500 to 507. The pipe registers 500 to 507 selectively receives any bit of the first and second group data in response to a mode selection signal SEL_MODE. Here, the mode selection signal SEL_MODE becomes a logic low level for the normal mode, and becomes a logic high level for the conversion mode.

In detail, the first to fourth even pipe registers 500, 502, 504 and 506 are designed to receive the first group data ECODE<0>, ECODE<2>, ECODE<4> and ECODE<6> when the mode selection signal SEL_MODE is a logic low level and the even pipe registers 500, 502, 504 and 506 are coupled to receive the mode selection signal SEL_MODE instead of a ground voltage VSS as shown in FIG. 5A. Further, the first to fourth even pipe registers 500, 502, 504 and 506 are designed to receive the second group data ECODE<1>, ECODE<3>, ECODE<5> and ECODE<7> if the mode selection signal SEL_MODE instead of a ground voltage VSS was received and the mode selection signal SEL_MODE is a logic high level. Likewise, the first to fourth odd pipe registers 501, 503, 505 and 507 receive the second group data ECODE<1>, ECODE<3>, ECODE<5> and ECODE<7> when the mode selection signal SEL_MODE is a logic low level. Further, the first to fourth odd pipe registers 501, 503, 505 and 507 receive the first group data ECODE<0>, ECODE<2>, ECODE<4> and ECODE<6> when the mode selection signal SEL_MODE is a logic high level.

Meanwhile, as shown in FIG. 5A, the first to fourth even pipe registers 500, 502, 504 and 506 receive a ground voltage VSS instead of the mode selection signal SEL_MODE. Accordingly, the first to fourth even pipe registers 500, 502, 504 and 506 receive the first group data ECODE<0>, ECODE<2>, ECODE<4> and ECODE<6> regardless of the modes such as normal mode and the conversion mode.

In the normal mode, when the mode selection signal SEL_MODE becomes a logic low level, the 8 bits of the error code ECODE<0:7> are stored in the respective pipe registers 500 to 507 bit by bit. On the contrary, in the conversion mode, when the mode selection signal SEL_MODE becomes a logic high level, the first to fourth odd pipe registers 501, 503, 505 and 507 as well as the first to fourth even pipe registers 500, 502, 504 and 506 receive the first group data ECODE<0>, ECODE<2>, ECODE<4> and ECODE<6>. As a result, in the conversion mode, the first even and odd pipe registers 500 and 501 store the first group data ECODE<0>, the second even and odd pipe registers 502 and 503 store the first group data ECODE<2>, the third even and odd pipe registers 504 and 505 store the first group data ECODE<4>, and the fourth even and odd pipe registers 506 and 507 store the first group data ECODE<6>.

Figure 5B:
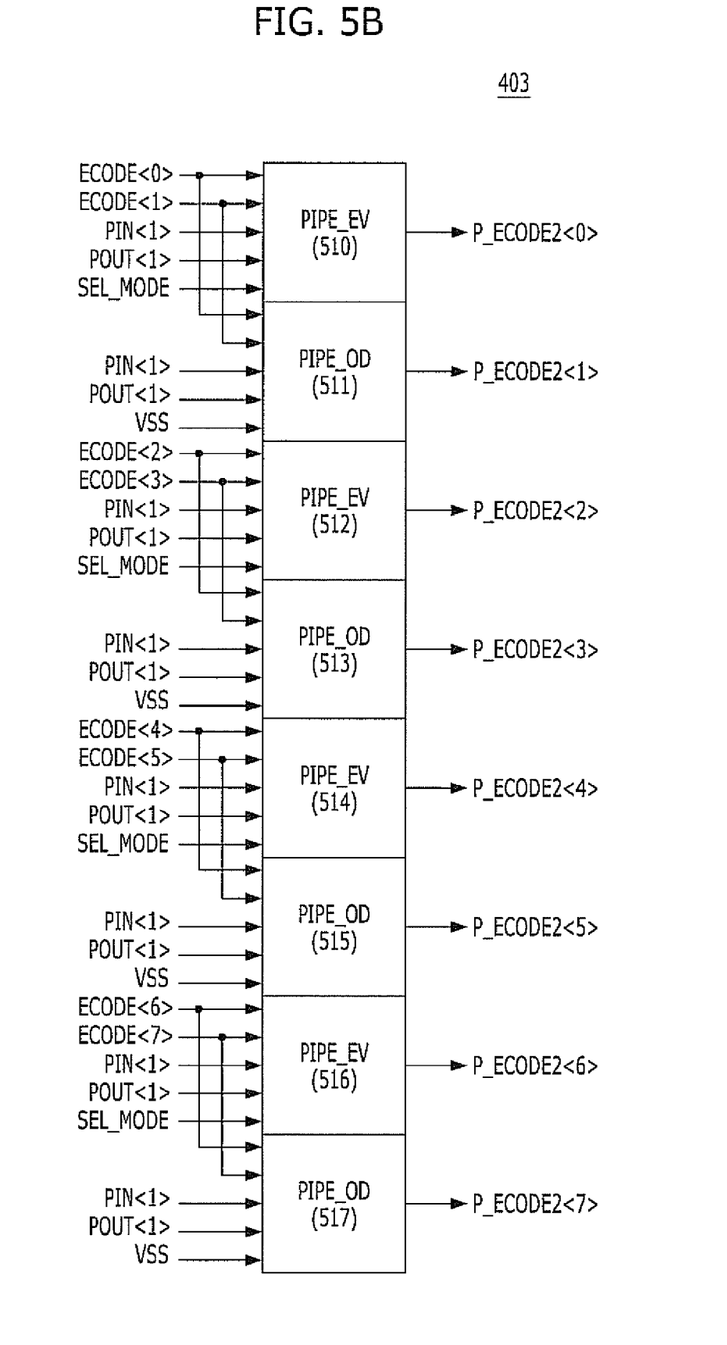
FIG. 5B is a detailed block diagram of a second storage unit shown in FIG. 4.

FIG. 5B is a detailed block diagram of the second storage unit 403 shown in FIG. 4.

Referring to FIG. 5B, the second storage unit 403 comprises a plurality of pipe registers 510 to 517, each configured to store a corresponding bit of the error code ECODE<0:7> bit-by-bit. Since the error code ECODE<0:7> is composed of 8-bit parallel data, the second storage unit 403 comprises 8 pipe registers 510 to 517 configured to store the 8 bits of the error code ECODE<0:7>.

The pipe registers 510 to 517 store the error code ECODE<0:7> in response to a second input control signal PIN<1> and output stored data as the second error data P_ECODE2<0:7> in response to a second output control signal POUT<1>. In case of the conversion mode, the first input control signal PIN<0> and the second input control signal PIN<1> are simultaneously activated while the second output control signal POUT<1> is activated at a different timing from the first input control signal POUT<0>. Thus, the first error data P_ECODE1<0:7> are outputted at a different timing from the second error data P_ECODE2<0:7>.

For illustration purposes, the pipe registers 510 to 517 are divided into a first group of pipe registers PIPE_EV and a second group of pipe registers PIPE_OD. The first group of pipe registers PIPE_EV includes first to fourth even pipe registers 510, 512, 514 and 516 while the second group of pipe registers PIPE_OD includes first to fourth odd pipe registers 511, 513, 515 and 517.

One bit of the first group data and one bit of the second group data are inputted to a corresponding one of the pipe registers 510 to 517. The pipe registers 510 to 517 selectively receives any bit of the first and second group data in response to the mode selection signal SEL_MODE, which becomes a logic low level for the normal mode, and becomes a logic high level for the conversion mode.

In detail, the first to fourth even pipe registers 510, 512, 514 and 516 receive the first group data ECODE<0>, ECODE<2>, ECODE<4> and ECODE<6> when the mode selection signal SEL_MODE is a logic low level. Further, the first to fourth even pipe registers 510, 512, 514 and 516 receive the second group data ECODE<1>, ECODE<3>, ECODE<5> and ECODE<7> when the mode selection signal SEL_MODE is a logic high level. Likewise, the first to fourth odd pipe registers 511, 513, 515 and 517 are designed to receive the second group data ECODE<1>, ECODE<3>, ECODE<5> and ECODE<7> when the mode selection signal SEL_MODE is a logic low level and the 511, 513, 515 and 517 are coupled to receive the mode selection signal SEL_MODE instead of a ground voltage VSS as shown in FIG. 5A. Further, the first to fourth odd pipe registers 511, 513, 515 and 517 are designed to receive the first group data ECODE<0>, ECODE<2>, ECODE<4> and ECODE<6> if the mode selection signal SEL_MODE instead of a ground voltage VSS was received and the mode selection signal SEL_MODE is a logic high level.

Unlike the first storage unit 401 of FIG. 5A, the first to fourth odd pipe registers 511, 513, 515 and 517 receive a ground voltage VSS instead of the mode selection signal SEL_MODE. Accordingly, the first to fourth odd pipe registers 511, 513, 515 and 517 receive the second group data ECODE<1>, ECODE<3>, ECODE<5> and ECODE<7> regardless of the modes (for example, normal mode and the conversion mode).

In the normal mode when the mode selection signal SEL_MODE becomes a logic low level, the 8 bits of the error code ECODE<0:7> are stored in the respective pipe registers 510 to 517 bit by bit. On the contrary, in the conversion mode when the mode selection signal SEL_MODE becomes a logic high level, the first to fourth even pipe registers 510, 512, 514 and 516 as well as the first to fourth odd pipe registers 511, 513, 515 and 517 receive the second group data ECODE<1>, ECODE<3>, ECODE<5> and ECODE<7>. As a result, in the conversion mode, the first even and odd pipe registers 510 and 511 store the second group data ECODE<1>, the second even and odd pipe registers 512 and 513 store the second group data ECODE<3>, the third even and odd pipe registers 514 and 515 store the second group data ECODE<5>, and the fourth even and odd pipe registers 516 and 517 store the second group data ECODE<7>.

Figure 6A:
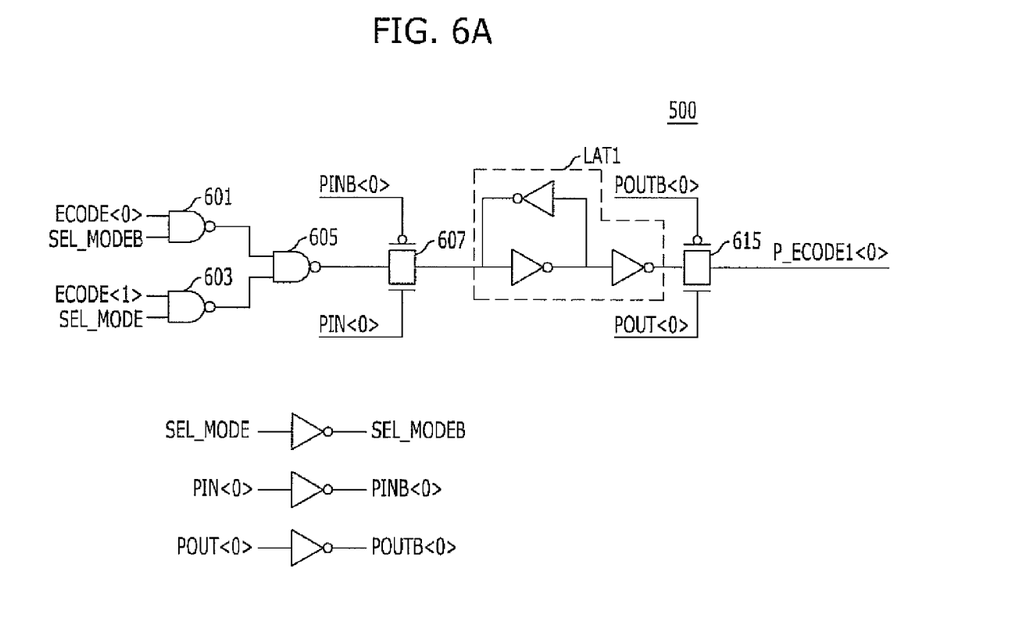
FIG. 6A is a circuit diagram illustrating a first even pipe register of the first storage unit shown in FIG. 5A.
Figure 6B:
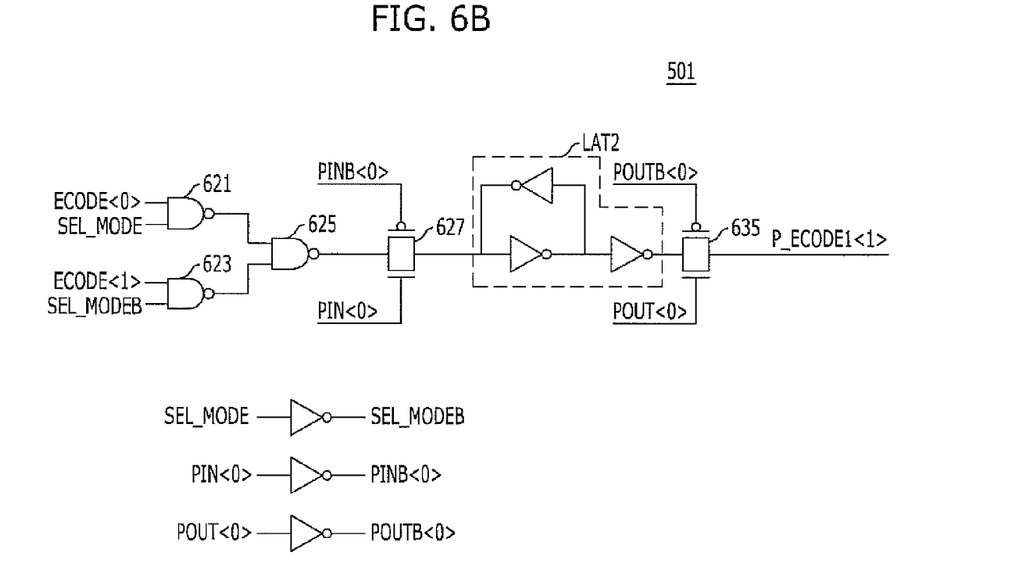
FIG. 6B is a circuit diagram illustrating a first odd pipe register of the first storage unit shown in FIG. 5A.

FIG. 6A is a circuit diagram illustrating the first even pipe register 500 shown in FIG. 5A, and FIG. 6B is a circuit diagram illustrating the first odd pipe register 501 shown in FIG. 5A.

For illustration purposes, the first group of pipe registers PIPE_EV of the first and second storage units 401 and 403 may be implemented with a structure shown in FIG. 6A, and the second group of pipe registers PIPE_OD of the first and second storage units 401 and 403 may be implemented with a structure shown in FIG. 6B.

Referring to FIG. 6A, the first even pipe register 500 comprises first to third NAND gates 601, 603 and 605, first and second pass gates 607 and 615, and a first latch unit LAT1. Referring to FIG. 6B, the first odd pipe register 501 comprises fourth to sixth NAND gates TO 621, 623 and 625, third and fourth pass gates 627 and 635, and a second latch unit LAT2.

In case of the first even pipe register 500, the first to third NAND gates 601 to 605 output the first group data ECODE<0> in response to the mode selection signal SEL_MODE of a logic low level and output the second group data ECODE<1> in response to the mode selection signal SEL_MODE of a logic high level. The first pass gate 607 transfers an output of the third NAND gate 605 in response to the first input control signal PIN<0>, and the first latch unit LAT1 latches an output of the first pass gate 607. Finally, the second pass gate 615 outputs the first error data P_ECODE1<0> in response to the first output control signal POUT<0>.

In case of the first odd pipe register 501, the fourth to sixth NAND gates 621 to 625 output the second group data ECODE<1> in response to the mode selection signal SEL_MODE of a logic low level and outputs the first group data ECODE<0> in response to the mode selection signal SEL_MODE of a logic high level. The third pass gate 627 outputs an output of the sixth NAND gate 625 in response to the first input control signal PIN<0>, and the second latch unit LAT2 latches an output of the third pass gate 627. Finally, the fourth pass gate 635 outputs the first error data P_ECODE1<1> in response to the first output control signal POUT<0>.

The above two pipe registers 500 and 501 show an exemplary structure of the first and second group of pipe registers PIPE_EV and PIPE_OD. However, since the first even pipe register 500 receives the ground voltage VSS instead of the mode selection signal SEL_MODE, the first even pipe register 500 selects and outputs the first group data ECODE<0> as the first error data P_ECODE1<0>.

Figure 7:
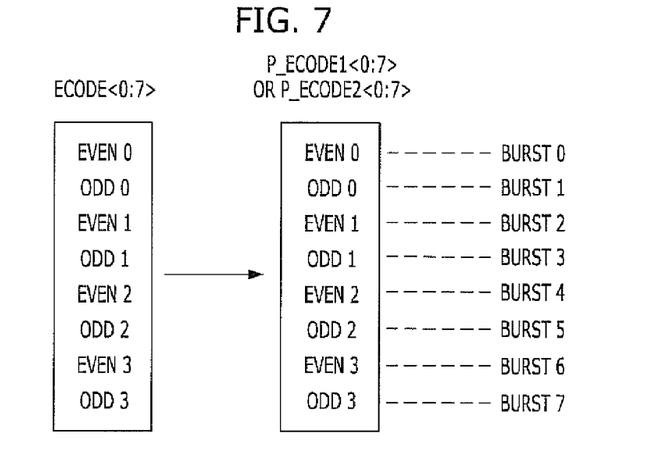
FIG. 7 is a configuration diagram illustrating an output pattern of an error code during a normal mode in accordance with an exemplary embodiment of the present invention.
Figure 8:
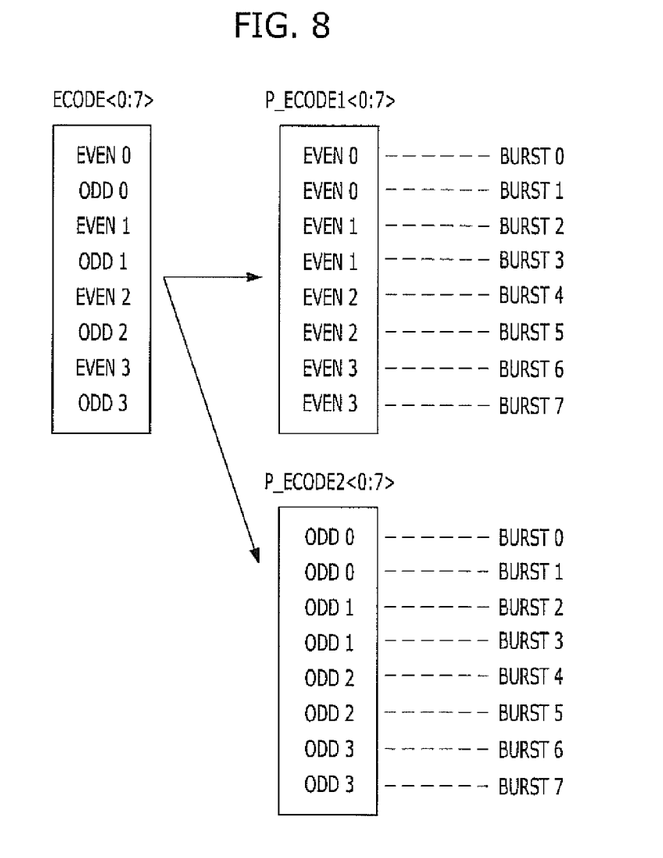
FIG. 8 is a configuration diagram illustrating an output pattern of an error code during a conversion mode in accordance with an exemplary embodiment of the present invention.

FIG. 7 and FIG. 8 are configuration diagrams illustrating an operation for outputting an error code ECODE<0:7> during a normal mode or a conversion mode, respectively, in accordance with an exemplary embodiment of the present invention.

Referring to FIG. 7, in the normal mode, any of the first and second storage units 401 and 403 stores the 8-bit error code ECODE<0:7> without changing patterns. Accordingly, the error code pattern generation circuit 400 stores the 8-bit error code ECODE<0:7> as is, and outputs the stored data as the first error data P_ECODE1<0:7> or the second error data P_ECODE2<0:7>.

On the contrary, referring to FIG. 8, in the conversion mode, the error code pattern generation circuit 400 divides the 8-bit error code ECODE<0:7> into the first group data, i.e., EVEN 0 to EVEN 3, and the second group data, i.e., ODD 0 to ODD 3. The first and second storage units 401 and 403 store the first and second group data, respectively, and then the first and second storage units 401 and 403 sequentially output the stored data at different times. Accordingly, in the conversion mode, after the first group data, i.e., EVEN 0 to EVEN 3, are outputted, and the second group data, i.e., ODD 0 to ODD 3, are outputted. As a result, a time for outputting the error code ECODE<0:7> during the conversion mode may increase to be twice that taken during the normal mode.

Figure 9:
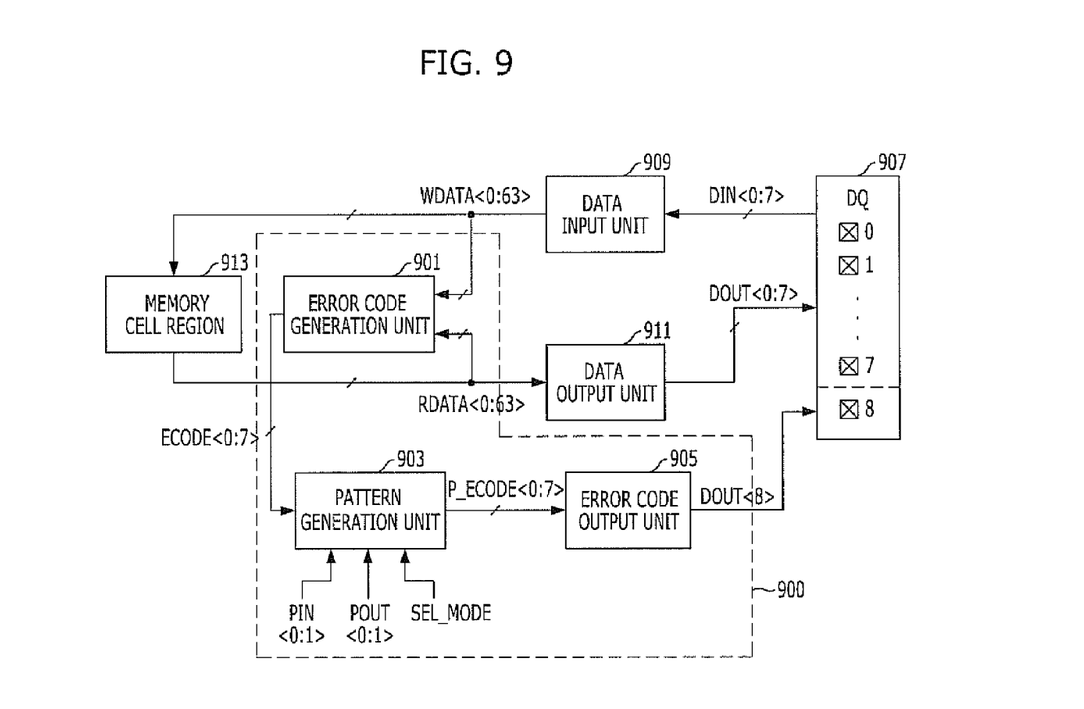
FIG. 9 is a block circuit illustrating a semiconductor memory device in accordance with an exemplary embodiment of the present invention.

FIG. 9 is a block circuit illustrating a semiconductor memory device in accordance with an exemplary embodiment of the present invention.

Referring to FIG. 9, the semiconductor memory device comprises an error code generation circuit 900 that includes an error code generation unit 901, a pattern generation unit 903, and an error code output unit 905. Further, the semiconductor memory device comprises a DQ region 907, a data input unit 909, a data output unit 911 and a memory cell region 913 in order to store data, receive the stored data and output the received data.

The error code generation unit 901 is configured to generate an error code ECODE<0:7> by using read data RDATA<0:63> in response to a read command RD or using write data WDATA<0:63> in response to a write command WT. The pattern generation unit 903 is configured to receive and divide the error code ECODE<0:7> into first and second group data to output error data P_ECODE<0:7>. The error code output unit 905 is configured to output the error data P_ECODE<0:7> to the outside of the semiconductor memory device through the DQ region 907.

When the read command RD is applied to the semiconductor memory device, the read data RDATA<0:63>, which are composed of 64-bit parallel data, are outputted from the memory cell region 913 to the data output unit 911 and the error code generation unit 901. After a designated time, the data output unit 911 serializes the 64-bit parallel read data RDATA<0:63> by an 8-bit unit at each time and outputs the serialized 8-bit data to the outside of the semiconductor memory device through a plurality of DQ pads DQ<0:7> of the DQ region 907.

When the write command WT is applied to the semiconductor memory device, the write data WDATA<0:63>, which are composed of 64-bit parallel data, are inputted through the DQ pads DQ<0:7> by an 8-bit unit at each time. The data input unit 909 parallelizes the write data WDATA<0:63> and transfers the parallelized write data WDATA<0:63> to the memory cell region 913 and the error code generation unit 901.

The error code generation unit 901 generates the 8-bit error code ECODE<0:7> as an error detection code (EDC) by performing Cyclic Redundancy Check (CRC) on the 64-bit read data RDATA<0:63> or the 64-bit write data WDATA<0:63>.

The pattern generation unit 903 is configured to have substantially the same configuration with the error code pattern generation circuit 400 shown in FIGS. 4 to 8. That is, the pattern generation unit 903 selectively operates according to a mode selection signal SEL_MODE which determines a normal mode and a conversion mode. Accordingly, the pattern generation unit 903 may store the 8-bit error code ECODE<0:7> as is and output the stored data as the error data P_ECODE<0:7> in the normal mode. Further, in the conversion mode, the pattern generation unit 903 may divide the 8-bit error code ECODE<0:7> into the first group data and the second group data and then sequentially output the stored data at different times, respectively. Accordingly, the pattern generation unit 903 may output various patterns according the modes.

The error code output unit 905 is configured to serialize the error data P_ECODE<0:7> to output the serialized error data to the outside of the semiconductor memory device through an output pad DQ<8> of the DQ region 907.

Figure 10:
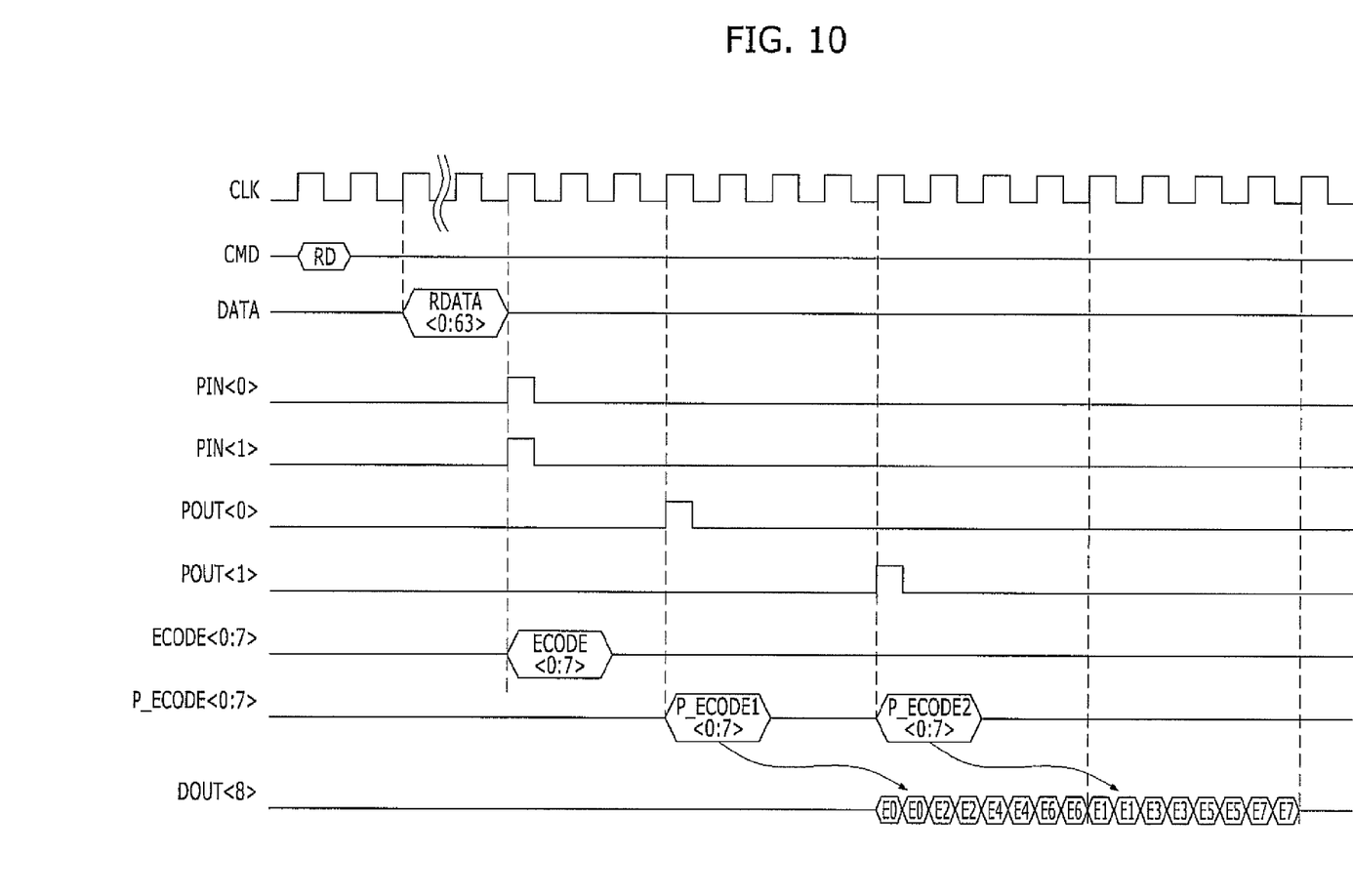
FIG. 10 is a timing diagram illustrating an operation for generating and outputting an error code in a conversion mode of the semiconductor memory device shown in FIG. 9.

FIG. 10 is a timing diagram illustrating an operation for generating and outputting the error code ECODE<0:7> in the conversion mode of the semiconductor memory device shown in FIG. 9.

Referring to FIG. 10, the 64-bit read data RDATA<0:63> are outputted from the memory cell region 913 to the error code generation unit 901 when the read command RD is applied to the semiconductor memory device.

The error code generation unit 901 generates the 8-bit error code ECODE<0:7> based on the 64-bit read data RDATA<0:63>. The pattern generation unit 903 receive and divide the 8-bit error code ECODE<0:7> into the first and second group data when the first and second input control signals PIN<0:1> are activated. At this time, the error code ECODE<0:7> is inputted to the pattern generation unit 903 as parallel data, and the first and second input control signals PIN<0:1> are simultaneously activated.

Subsequently, the pattern generation unit 903 transfers the first error data PECODE1<0:7> as the error data P_ECODE<0:7> when the first output control signal POUT<0> is activated. After a designated time, the pattern generation unit 903 transfers the second error data P_ECODE2<0:7> as the error data P_ECODE<0:7> when the second output control signal POUT<1> is activated.

The error code output unit 905 receives the first and second error data P_ECODE1<0:7> and P_ECODE2<0:7> and serialize the error data to output the serialized error data to the outside of the semiconductor memory device through the output pad DQ<8> of the DQ region 907.

Though it is not shown, in case where the write command WT is applied, the error code ECODE<0:7> is generated by using the 64-bit write data WDATA<0:63> inputted through the DQ pads DQ<0:7> from the outside of the semiconductor memory device. The generation and output of the error data is similar to the above read operation.

According to an exemplary embodiment of the present invention, an error code generation circuit, which is capable of outputting an error code in various patterns, and a semiconductor memory device including the same are provided. Accordingly, even if the error code generation circuit operates at a high frequency, a low frequency test device can receive and verify the error code outputted from the error code generation circuit. More specifically, in the exemplary embodiment of the present invention, the error code generation circuit operates in a different way according to a normal mode and a conversion mode. In the normal mode, the error code generation circuit stores the error code as it is, and output the stored data as error data. On the other hand, in the conversion mode, the error code generation circuit divides the error code into first and second group data, and then sequentially output the stored data at different times, respectively. Accordingly, the error code generation circuit may output various patterns according to different modes.

Furthermore, by outputting the first and second group data during a different time period, the error code generation circuit may output the error code in two or more cycles during the conversion mode. As a result, a window for outputting the error code during the conversion mode may increase.

While the present invention has been described with respect to the specific embodiments, it will be apparent to those skilled in the art that various changes and modifications may be made without departing from the spirit and scope of the invention as defined in the following claims.

What is claimed is:

1. An error code pattern generation circuit comprising:
    a first storage unit configured to store at least one bit of an error code and output error data for a first time period; and
    a second storage unit configured to store at least one remaining bit of the error code and output the error data for a second time period which is different from the first time period,
    wherein each of the first and second storage units comprises a plurality of pipe registers that are each configured to store a corresponding bit of the error code, and
    wherein at least one of the pipe registers is configured to receive one bit of a first group of data in the error code and one bit of a second group of data in the error code and select the first group of data or the second group of data depending on different operation modes that the error code pattern generation circuit operates in, respectively.

2. The error code pattern generation circuit of claim 1, wherein the first group of data comprises even-bit data of the error code and the second group of data comprises odd-bit data of the error code.

3. The error code pattern generation circuit of claim 1, wherein
    a first group of the pipe registers are configured to store the first group of data and a second group of the pipe registers are configured to store the second group of data in a normal mode,
    the pipe registers of the first storage unit are configured to store the first group of data in a conversion mode, and
    the pipe registers of the second storage unit are configured to store the second group of data in the conversion mode.

4. The error code pattern generation circuit of claim 1, wherein the error code includes an error detection code (EDC) which is generated by performing cyclic redundancy check (CRC).

5. The error code pattern generation circuit of claim 1, wherein the first storage unit is configured not to output the at least one remaining bit of the error code during the first time period and the second storage unit is configured to not output the at least one bit of the error code during the second time period.

6. A semiconductor memory device comprising:
    an error code generation unit configured to generate an error code by using read data or write data;
    a pattern generation unit configured to generate error data by dividing the error code into first and second groups of data; and
    an error code output unit configured to output the error data,
    wherein the pattern generation unit comprises:
        a first storage unit configured to store at least one bit of an error code and output error data for a first time period; and
        a second storage unit configured to store at least one remaining bit of the error code and output the error data for a second time period which is different from the first time period,
    wherein each of the first and second storage units comprises a plurality of pipe registers that are each configured to store a corresponding bit of the error code, and
    wherein at least one of the pipe registers is configured to receive one bit of the first group of data and one bit of the second group of data and select one of the first and second groups of data depending on different operation modes that the pattern generation unit operates in, respectively.

7. The semiconductor memory device of claim 6, wherein the first group of data comprises even-bit data of the error code and the second group of data comprises odd-bit data of the error code.

8. The semiconductor memory device of claim 6, wherein
a first group of the pipe registers are configured to store the first group of data and a second group of the pipe registers are configured to store the second group data in a normal mode
the pipe registers of the first storage unit are configured to store the first group data in a conversion mode, and
the pipe registers of the second storage unit are configured to store the second group of data in the conversion mode.

9. The semiconductor memory device of claim 6, wherein the read data are parallel data having plural bits, which are transferred to the error code generation unit from a memory cell region and the write data are parallel data having plural bits, which are transferred to the error code generation unit to be stored in the semiconductor memory device.

10. The semiconductor memory device of claim 6, wherein the error code generation unit is configured to generate the error code as an error detection code (EDC) by performing cyclic redundancy check (CRC).

11. The semiconductor memory device of claim 6, wherein the error code output unit is configured to serialize the error data to output the serialized error data through an output pad.

12. An error code pattern generation circuit comprising:
a first storage unit configured to store at least one bit of an error code and output error data for a first time period; and
a second storage unit configured to store at least one remaining bit of the error code and output the error data for a second time period which is different from the first time period,
wherein the first storage unit is configured not to output the at least one remaining bit of the error code during the first time period and the second storage unit is configured to not output the at least one bit of the error code during the second time period.

\* \* \* \* \*